US009453851B2

(12) United States Patent
Ohkoshi

(10) Patent No.: US 9,453,851 B2
(45) Date of Patent: *Sep. 27, 2016

(54) COMPOSITE SENSOR FOR DETECTING ANGULAR VELOCITY AND ACCELERATION

(71) Applicant: Panasonic Intellectual Property Management Co., Ltd., Osaka (JP)

(72) Inventor: Hideo Ohkoshi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/716,111

(22) Filed: May 19, 2015

(65) Prior Publication Data

US 2015/0253348 A1    Sep. 10, 2015

Related U.S. Application Data

(63) Continuation of application No. 12/679,412, filed as application No. PCT/JP2008/002765 on Oct. 2, 2008, now Pat. No. 9,069,000.

(30) Foreign Application Priority Data

Oct. 10, 2007    (JP) ................. 2007-264287

(51) Int. Cl.
*G01P 1/02*    (2006.01)
*G01P 3/00*    (2006.01)
(Continued)

(52) U.S. Cl.
CPC ............. *G01P 1/02* (2013.01); *G01C 19/5607* (2013.01); *G01C 21/10* (2013.01); *G01P 1/023* (2013.01);
(Continued)

(58) Field of Classification Search
CPC ... G01C 19/5607; G01P 15/18; G01P 1/023; G08B 23/00; G08B 25/14; G08B 17/00; G08B 17/10; G08B 3/10; G08B 13/1672; G08B 21/12; G08B 25/10
See application file for complete search history.

(56) References Cited

U.S. PATENT DOCUMENTS 5,243,130 A    9/1993    Kitagawa
6,157,080 A    12/2000    Tamaki et al.
(Continued)

FOREIGN PATENT DOCUMENTS

EP    1085787 A2    3/2001
GB    2392721 A    3/2004
(Continued)

OTHER PUBLICATIONS

International Search Report for Application No. PCT/JP2008/002765 dated Jan. 6, 2009.
(Continued)

*Primary Examiner* — Sisay Yacob
(74) *Attorney, Agent, or Firm* — Pearne & Gordon LLP

(57) ABSTRACT

A composite sensor for detecting angular velocity and acceleration includes an angular velocity detecting element, an acceleration detecting element, an angular velocity signal processing IC, an acceleration signal processing IC, and a housing. The housing is formed of a multilayered circuit board and accommodates the angular velocity detecting element, the acceleration detecting element, the angular velocity signal processing IC, and the acceleration signal processing IC. The housing connects the angular velocity detecting element electrically to the angular velocity signal processing IC, and also connects the acceleration detecting element electrically to the acceleration signal processing IC.

18 Claims, 9 Drawing Sheets

(51) Int. Cl.
*G01P 15/00* (2006.01)
*G01C 21/10* (2006.01)
*G01C 19/5607* (2012.01)
*G01P 15/18* (2013.01)

(52) U.S. Cl.
CPC ................ *G01P 3/00* (2013.01); *G01P 15/00* (2013.01); *G01P 15/18* (2013.01); *H01L 2224/0557* (2013.01); *H01L 2224/05573* (2013.01); *H01L 2224/16225* (2013.01); *H01L 2224/32145* (2013.01); *H01L 2224/48465* (2013.01); *H01L 2224/73265* (2013.01); *H01L 2924/00014* (2013.01)

(56) References Cited

U.S. PATENT DOCUMENTS

| | | |
|---|---|---|
| 6,259,937 B1 | 7/2001 | Schulman et al. |
| 6,521,830 B1 | 2/2003 | Platz |
| 6,593,663 B2 | 7/2003 | Ikezawa et al. |
| 6,829,937 B2 | 12/2004 | Mahon |
| 7,155,975 B2 | 1/2007 | Mitani et al. |
| 2002/0102769 A1 | 8/2002 | Shibue |
| 2003/0006508 A1 | 1/2003 | Ikesawa et al. |
| 2004/0163470 A1 | 8/2004 | Babala et al. |
| 2005/0017340 A1 | 1/2005 | Shibue |
| 2005/0040718 A1 | 2/2005 | Sesselmann |
| 2005/0199062 A1 | 9/2005 | Ookoshi |
| 2006/0027841 A1 | 2/2006 | Tamaki |
| 2006/0197414 A1 | 9/2006 | Takahashi et al. |
| 2007/0090536 A1 | 4/2007 | Sakai et al. |
| 2007/0108604 A1 | 5/2007 | Yim |
| 2007/0158822 A1 | 7/2007 | Fujii |
| 2009/0013784 A1 | 1/2009 | Ohkoshi |

FOREIGN PATENT DOCUMENTS

| | | |
|---|---|---|
| JP | 03-022544 A | 1/1991 |
| JP | 10-73615 A | 3/1998 |
| JP | 11-003969 A | 1/1999 |
| JP | 11-219984 A | 8/1999 |
| JP | 11-325908 | 11/1999 |
| JP | 2001-110928 A | 4/2001 |
| JP | 2001-160449 A | 6/2001 |
| JP | 2002-026181 A | 1/2002 |
| JP | 2002-222914 A | 8/2002 |
| JP | 2003-004450 | 1/2003 |
| JP | 2003-021647 | 1/2003 |
| JP | 2006-049569 A | 2/2006 |
| JP | 2007-115964 | 5/2007 |
| JP | 2007-248328 | 9/2007 |

OTHER PUBLICATIONS

European Office Action for Application No. 08 838 083.7-2213 dated Apr. 8, 2011.
European Search Report for Application No. 08838083.7-2213 dated Sep. 15, 2010.

COMPOSITE SENSOR FOR DETECTING ANGULAR VELOCITY AND ACCELERATION

This application is a continuation of U.S. patent application Ser. No. 12/679,412 filed on Mar. 22, 2010, which is U.S. national phase application of PCT international application PCT/JP2008/002765.

TECHNICAL FIELD

The present invention relates to a composite sensor to be used for posture control or navigation systems of movable bodies such as aircrafts and vehicles.

BACKGROUND ART

A conventional composite sensor for detecting angular velocity and acceleration is configured as shown in FIGS. 8 to 11. FIGS. 8 and 9 show an exploded perspective view and a lateral sectional view of the conventional composite sensor for detecting angular velocity and acceleration. FIG. 10 shows a perspective view of an angular velocity detecting element of the conventional composite sensor for detecting angular velocity and acceleration. FIG. 11 shows a perspective view of the conventional composite sensor for detecting angular velocity and acceleration. This composite sensor includes angular velocity detecting unit 1, acceleration detecting unit 11, circuit board 15, shield case 18, protective case 25, and protective lid 36.

Angular velocity detecting unit 1 is formed of vibrator 2, housing 3, and lid 4 as shown in FIG. 10. Vibrator 2 is a tuning fork formed by bonding two thin plates made of single-crystal quartz together. Each plate of single-crystal quartz has a crystal axis different from each other. As shown in FIG. 10, vibrator 2 includes driving electrodes 5 on the front face and rear face, and detecting electrodes 6 on the outer lateral face and an inner lateral face.

Housing 3 accommodates vibrator 2 and has an opening (not shown) at the top face. Lid 4 closes the opening provided at the top face of housing 3. As shown in FIG. 8, power-supply terminal 7, angular velocity output terminal 8, and GND terminal 9 extend from the top face to the underside of lid 4. First ends of power-supply terminal 7 and angular velocity terminal 8 are electrically connected to driving electrodes 5 in vibrator 2, respectively. A first end of angular velocity output terminal 8 is electrically connected to detecting electrodes 6 of vibrator 2.

Acceleration detecting unit 11 has an acceleration signal processing IC (not shown) built-in. In acceleration detecting unit 11, a movable electrode plate (not shown), and a fixed electrode plate (not shown) are provided therein. Acceleration detecting unit 11 has power-supply terminal 12, X-axis acceleration output terminal 13A, Y-axis acceleration output terminal 13B, and GND terminal 14 each protruding outward. First ends of those terminals are electrically connected to the movable electrode plate and the fixed electrode plate.

Angular velocity detecting unit 1 is rigidly mounted to the underside of circuit board 15, which has a large number of holes 16 through which the terminals are supposed to extend from the top face to the underside of board 15. Power-supply terminal 7, angular velocity output terminal 8, and GND terminal 9 of angular velocity detecting unit 1 extend through holes 16. Acceleration detecting unit 11 is also rigidly mounted to the underside of circuit board 15. On the top face of board 15, angular velocity signal processing IC 17 is placed and IC 17 is formed of electronic components structuring an automatic gain control (AGC) circuit (not shown). IC 17 is electrically connected with power-supply terminal 7, angular velocity output terminal 8, GND terminal 9, power-supply terminal 12, X-axis acceleration output terminal 13A, Y-axis acceleration output terminal 13B, and GND terminal 14.

Metallic shield case 18 is formed of housing section 18A and lid 18C closing opening 18B of housing section 18A. Shield case 18 accommodates circuit board 15, angular velocity detecting unit 1, and acceleration detecting unit 11. Power-supply relay terminal 19, GND relay terminal 20, angular velocity relay terminal 21, X-axis acceleration relay terminal 22, and Y-axis acceleration relay terminal extend from the inside to the outside of shield case 18. Power-supply relay terminal 19 is electrically connected to power-supply terminals 7 and 12. GND relay terminal 20 is electrically connected to GND terminals 9 and 14. Angular velocity relay terminal 21 is electrically connected to angular velocity output terminal 8. X-axis acceleration relay terminal 22 is electrically connected to X-axis acceleration output terminal 13A. Y-axis acceleration relay terminal 23 is electrically connected to Y-axis acceleration output terminal 13B.

Lid 18C has elastic protrusions 24 at vertical face 18D, and elastic protrusions 24 elastically fit lid 18C onto the outer face around opening 18B of shield case 18, so that housing section 18A and lid 18C have the same electrical potential.

Protective case 25 made of resin is cylindrical and has a bottom, and accommodates shield case 18. Connector section 26 protrudes from the lateral face of protective case 25 to the outside. Inside connector section 26, first ends of power-supply connector terminal 27, angular velocity connector terminal 28, X-axis acceleration connector terminal 29, Y-axis acceleration connector terminal 30, and GND connector terminal 31 are provided. Second ends of these terminals are buried in protective case 25. Protective lid 36 made of resin closes the opening formed on the top face of protective case 25.

As shown in FIG. 11, through-holes 32 are formed so as to extend from the bottom of protective case 25 to the outside of case 25. Second ends of power-supply connector terminal 27, angular velocity connector 28, X-axis acceleration connector 29, Y-axis acceleration connector 30, and GND connector 31 are placed inside the through-holes 32. As shown in protective case 25 in FIG. 9, the second end of X-axis acceleration relay terminal 22 runs into the hole (not shown) where X-axis acceleration connecter terminal 29 runs, and the second end is electrically joined to terminal 29 with solder 35. In a similar way, the second end of Y-axis acceleration relay terminal 23 runs into the hole (not shown) where Y-axis acceleration connecter terminal 30 runs, and the second end is electrically joined to terminal 30. The second end of power-supply relay terminal 19 runs into the hole (not shown) where power-supply connecter terminal 27 runs, and the second end is electrically joined to terminal 27. The second end of angular velocity relay terminal 21 runs into the hole (not shown) where angular velocity terminal 28 runs, and the second end is electrically joined to terminal 28. The second end of GND relay terminal 20 runs into the hole (not shown) where GND connector terminal 31 runs, and the second end is electrically joined to terminal 31. The composite sensor for detecting angular velocity and acceleration discussed above is disclosed in, e.g. Patent Literature 1.

Next, the operation of the conventional composite sensor for detecting angular velocity and acceleration discussed above is described hereinafter. First, a DC voltage supplied from the power supply (not shown) externally provided is applied to angular velocity signal processing IC 17 via power-supply terminals 27 and power-supply relay terminals 19, then is converted into an AC voltage. This AC voltage is applied to driving electrodes 5 of vibrator 2 of angular velocity detecting unit 1 via power-supply terminal 7. Driving electrodes 5 are grounded via CND connector terminal 31, GND relay terminal 20, and GND terminal 9. The foregoing electrical connections allow vibrator 2 to vibrate flexibly.

In the foregoing status, angular velocity detecting unit 1 rotates at angular velocity ω on the longitudinal center axis of vibrator 2, then Coriolis force F=2 mv×ω is generated to vibrator 2, where "m" stands for mass of the arm section of the tuning fork of vibrator 2, and "v" stands for velocity of the flexion movement. Coriolis force F generates electric charges on detecting electrodes 6, and the electric charges produce an output signal which travels to angular velocity signal processing IC 17 in circuit board 15 via angular velocity output terminal 8. Angular velocity signal processing IC 17 converts this output signal into an output voltage, which is supplied to an external computer (not shown) via angular velocity relay terminal 21 and angular velocity connector terminal 28. The computer then detects an angular velocity based on this output voltage.

A voltage of 5V is applied to the movable electrode plate (not shown) and the fixed electrode plate (not shown) of acceleration detecting unit 11 via power-supply connector terminal 27, power-supply relay terminal 19, and power-supply terminal 7. In this status, acceleration is applied onto the plane of acceleration detecting unit 11 along the horizontal direction, i.e. X-axis and Y-axis, then the movable electrode plate is moved, which changes the capacitance of a capacitor (not shown) formed between the movable electrode plate and the fixed electrode plate. Acceleration detecting unit 11 then converts this change in capacitance into an output voltage. The output voltage corresponding to the acceleration along the X-axis is supplied to the computer (not shown) via X-axis acceleration output terminal 13A, X-axis acceleration relay terminal 22, and X-axis acceleration connector terminal 29. The computer detects the acceleration along the X-axis based on this output voltage. In a similar way, the output voltage corresponding to the acceleration along the Y-axis is supplied to the computer (not shown) via Y-axis acceleration output terminal 13B, Y-axis acceleration relay terminal 23, and Y-axis acceleration connector terminal 30. The computer detects the acceleration along the Y-axis based on this output voltage. The computer then analyzes angular velocities, accelerations along the X-axis and the Y-axis applied to a vehicle body, thereby analyzing the behavior of the vehicle body.

The structure discussed above includes circuit board 15 placed inside the shield case 18, and angular velocity signal processing IC 17 mounted on the top face of circuit board 15. Acceleration detecting unit 11 including the acceleration signal processing IC (not shown) therein is mounted on the underside of circuit board 15. The composite sensor for detecting angular velocity and acceleration is thus bulky.

Patent Literature 1: Unexamined Japanese Patent Publication No. 2003-4450

SUMMARY OF THE INVENTION

The present invention provides a downsized composite sensor for detecting angular velocity and acceleration. The composite sensor for detecting angular velocity and acceleration includes an angular velocity detecting element, an acceleration detecting element, an angular velocity signal processing IC, an acceleration signal processing IC, and a housing. The angular velocity signal processing IC processes an output signal supplied from the angular velocity detecting element. The acceleration signal processing IC processes an output signal supplied from the acceleration detecting element. The housing formed of a multilayered circuit board accommodates the angular velocity detecting element, the acceleration detecting element, the angular velocity signal processing IC, and the acceleration signal processing IC. The housing electrically connects the angular velocity detecting element to the angular velocity signal processing IC as well as connects the acceleration detecting element to the acceleration signal processing IC electrically. Use of the housing discussed above allows eliminating a circuit board for wiring, so that the composite sensor for detecting angular velocity and acceleration can be downsized.

DETAILED DESCRIPTION OF THE INVENTION

Figure 1:
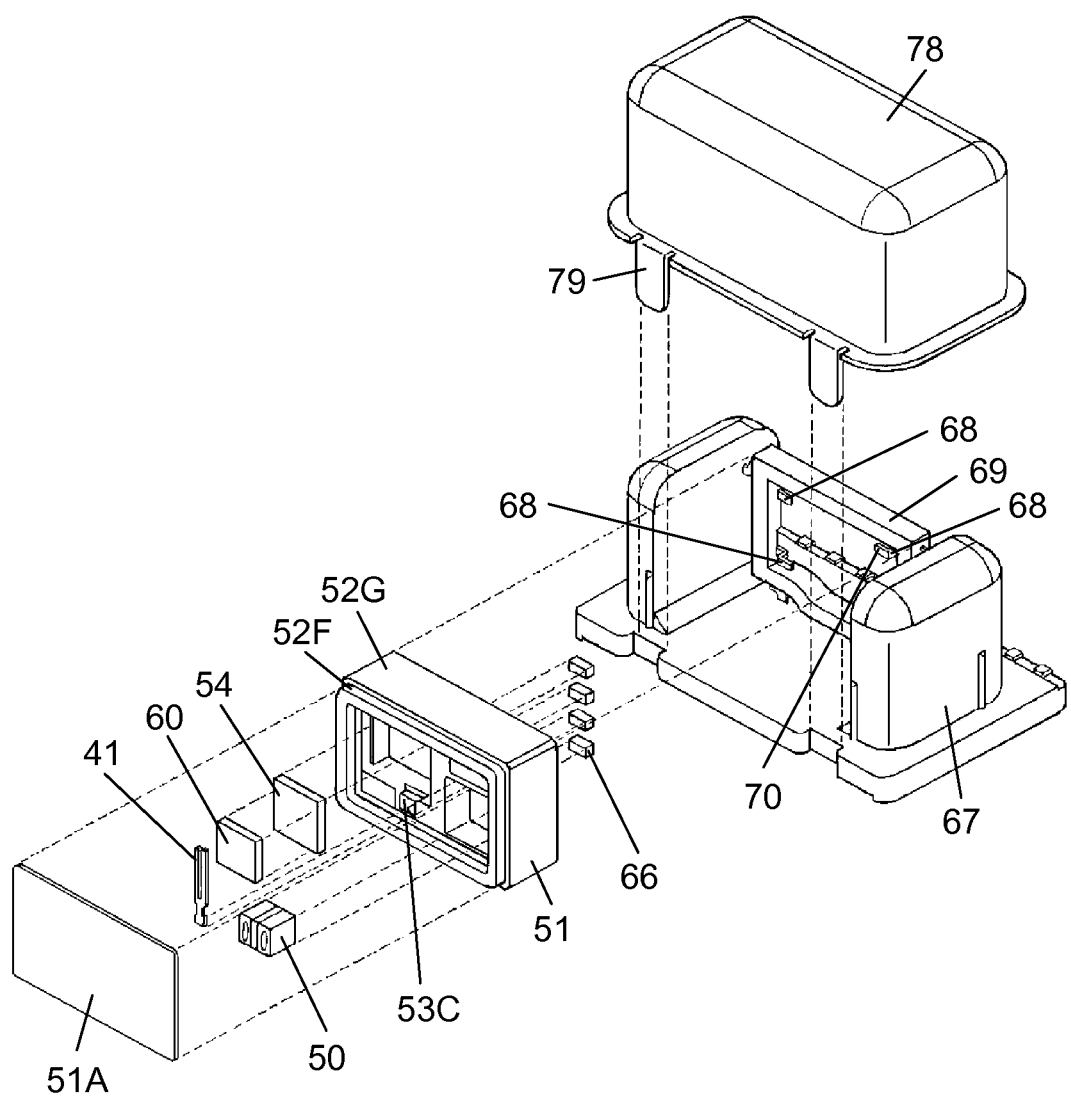
FIG. 1 is an exploded perspective view of a composite sensor for detecting angular velocity and acceleration in accordance with an embodiment of the present invention.
Figure 2:
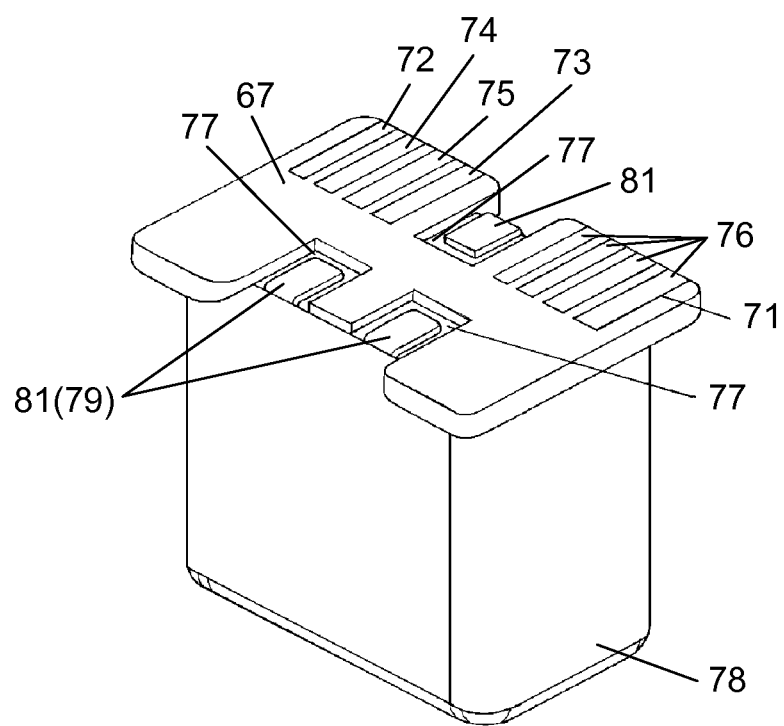
FIG. 2 is a perspective view shown from the rear side of the composite sensor for detecting angular velocity and acceleration shown in FIG. 1.
Figure 3:
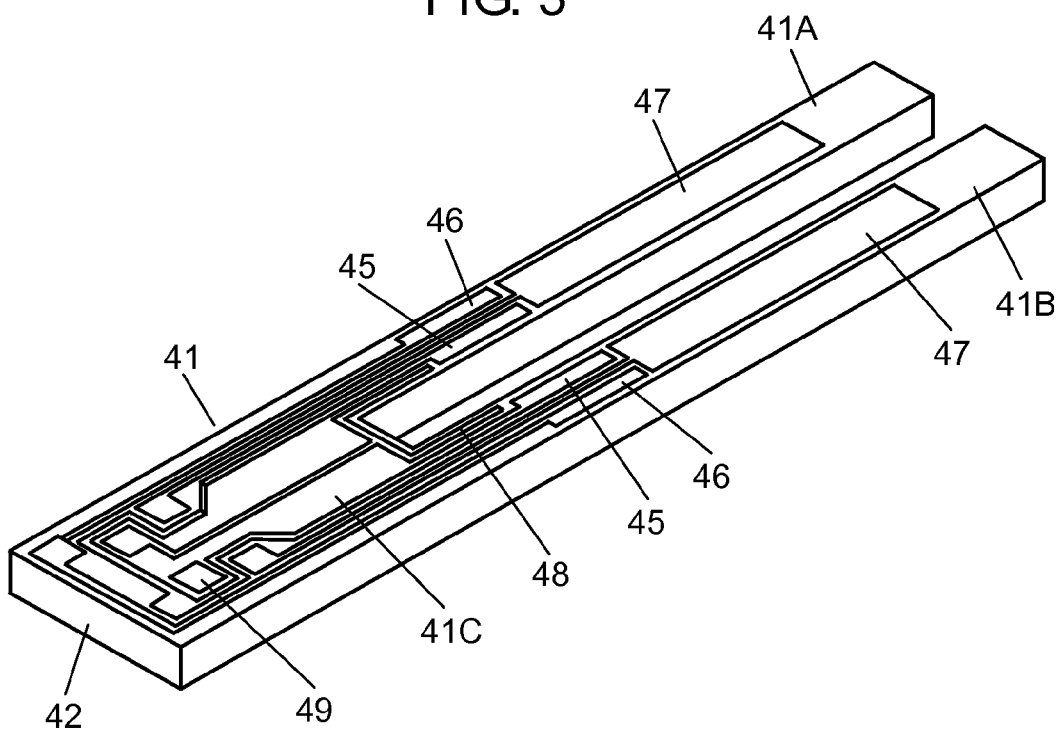
FIG. 3 is a perspective view of an angular velocity detecting element of the composite sensor for detecting angular velocity and acceleration shown in FIG. 1.
Figure 4:
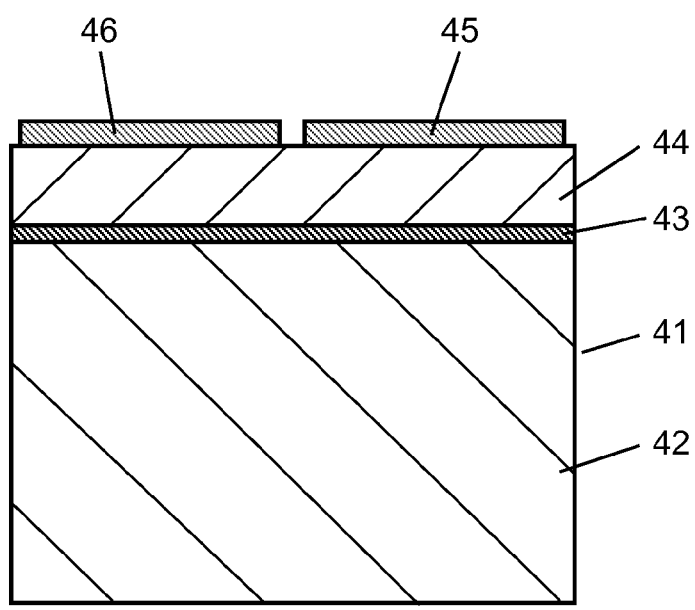
FIG. 4 is a sectional view of a first arm section of the angular velocity detecting element of the composite sensor for detecting angular velocity and acceleration shown in FIG. 1.
Figure 5:
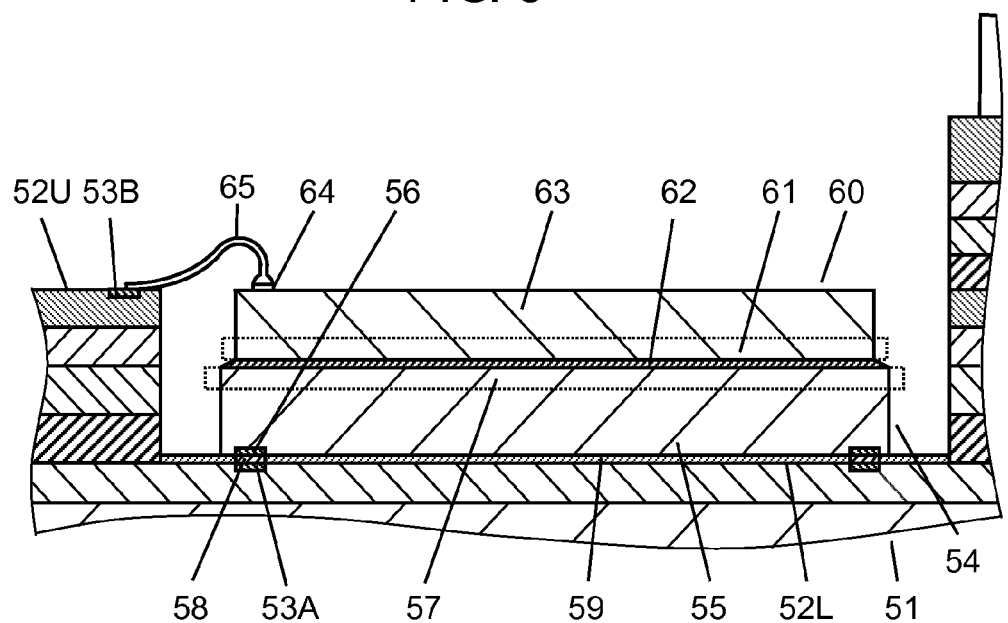
FIG. 5 is a lateral sectional view of the vicinity around an angular velocity signal processing IC and an acceleration signal processing IC in a housing of the composite sensor for detecting angular velocity and acceleration shown in FIG. 1.
Figure 6:
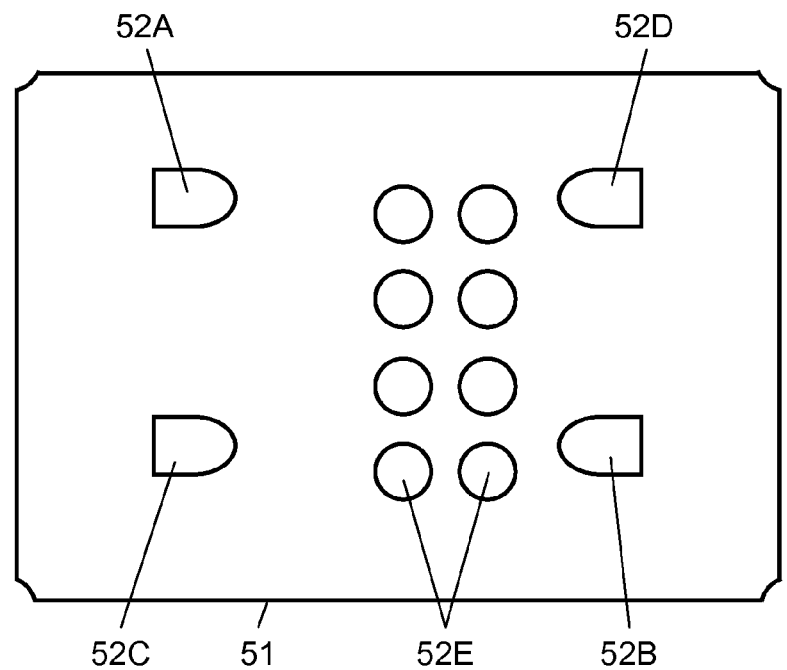
FIG. 6 is a bottom view of the housing of the composite sensor for detecting angular velocity and acceleration shown in FIG. 1.

FIG. 1 and FIG. 2 are an exploded perspective view and a perspective view of a composite sensor for detecting angular velocity and acceleration in accordance with an embodiment of the present invention. FIG. 3 is a perspective view of an angular velocity detecting element of the composite sensor for detecting angular velocity and acceleration. FIG. 4 is a sectional view of a first arm section of the angular velocity detecting element. FIG. 5 is a lateral sectional view of the vicinity around an angular velocity signal processing IC and an acceleration signal processing IC placed in a housing of the composite sensor. FIG. 6 is a bottom view of the housing. The composite sensor has angular velocity detecting element 41, acceleration detecting element 50, angular velocity signal processing IC 54, acceleration signal processing IC 60, housing 51, capacitor 66, compartment 67, mounting section 69, and cover 78.

As shown in FIG. 3, angular velocity detecting element 41 shaped like a tuning fork is formed of first arm section 41A, second arm section 41B, and joint 41C, where first arm section 41A and second arm section 41B are connected together at their first ends. As shown in FIGS. 3 and 4, angular velocity detecting element 41 has base 42, common GND electrode 43, piezoelectric layer 44, a pair of first driving electrodes 45, and a pair of second driving electrodes 46.

Base 42 is made of silicon (Si). Common GND electrode 43 made of alloy thin film of platinum (Pt) and titanium (Ti) is formed extending the entire top face of base 42. Piezoelectric layer 44 is formed of a thin film of lead zirconate titanate (PZT) on the top face of common GND electrode 43 is. First driving electrodes 45 are placed on the top face of piezoelectric layer 44 such that they are positioned inside and at the approx. center of the top face of angular velocity detecting element 41. Second driving electrodes 46 are placed on the top face of piezoelectric layer 44 such that they are positioned at the approx. center and yet outside first driving electrodes 45 placed on the top face of angular velocity detecting element 41.

A pair of detecting electrodes 47 are placed on the top face of angular velocity detecting element 41. Specifically, detecting electrodes 47 are placed on the top face of piezoelectric layer 44 near to the tips of the respective arm sections than the first driving electrode 45. Monitoring electrode 48 is placed on the top face of piezoelectric layer 44 at the root side of detecting element 41 than first driving electrode 45. GND electrode 49 is placed on the surface of piezoelectric layer 44 at junction 41C.

Acceleration detecting element 50 converts the applied acceleration into an electric signal. An example of detecting element 50 and its operational principle are disclosed in U.S. Pat. No. 6,829,937, for example.

As shown in FIG. 5, housing 51 is formed of a multilayered circuit board including layers of ceramic and wiring conductor. The layers extend from the inner bottom face to the outer bottom face. Housing 51 accommodates angular velocity detecting element 41, acceleration detecting element 50, angular velocity signal processing IC 54, and acceleration signal processing IC 60.

Housing connection electrodes 53A as first housing connection electrodes are placed on mounting face 52L which is the inner bottom face, namely, the lowest floor, of housing 51. Housing connection electrode 53B as second housing connection electrode is placed on wiring face 52U which is a floor higher than mounting face 52L. Wirings supposed to be placed in the layers of housing 51 are omitted here.

As shown in FIG. 1, step section 53C is provided inside the housing 51, and lid 51A closes the opening of housing 51. The underside of junction 41C of angular velocity detecting element 41 is fixed to the top face of step section 53C. Although not shown in the drawings, a plurality of electrodes similar to housing connection electrode 53B, which is described later, are formed on wiring face 52U of housing 51. Those electrodes on wiring face 52U are electrically connected via wires 65 to first driving electrodes 45, second driving electrodes 46, detecting electrode 47, monitoring electrode 48, and GND electrode 49 by the wire-bonding method.

Angular velocity signal processing IC 54 includes functional section 55 on its bottom face, and a plurality of IC electrodes 56 are provided in functional section 55 such that they confront housing connection electrode 53A. Non-functional section 57 is provided at the top face of IC 54. Electrode bumps 58 electrically connect IC electrodes 56 of angular velocity signal processing IC 54 with housing connection electrodes 53A of housing 51. Underfill material 59 is provided on the entire face of IC 54 except IC electrodes 56, and bonds angular velocity signal processing IC 54 to the inner bottom face (mounting face 52L) of housing 51.

Acceleration signal processing IC 60 includes non-functional section 61 at its underside, and non-functional section 61 is connected to non-functional section 57 of angular velocity signal processing IC 54 with adhesive 62. In other words, angular velocity signal processing IC 54 and acceleration signal processing IC 60 are layered together in housing 51, so that the composite sensor for detecting angular velocity and acceleration can be downsized.

Acceleration signal processing IC 60 includes functional section 63 at its top face, and IC electrode 64 is provided at functional section 63 on approx. the same plane as the top face of acceleration signal processing IC 60. IC electrode 64 is electrically connected to housing connection electrode 53B with wire 65.

In other words, angular velocity signal processing IC 54 and acceleration signal processing IC 60 include non-functional sections 57 and 61 respectively on their faces bonded together, and also include functional sections 55 and 63 respectively on the opposite faces to their faces where non-functional sections 57 and 61 are placed. Functional section 55 has IC electrode 56 for external connection, and functional section 63 has IC electrode 64 for external connection. IC electrode 56 of functional section 55 can be thus connected electrically to housing connection electrode 53A directly or via electrode bump 58 at a minimum distance. As a result, the composite sensor for detecting angular velocity and acceleration can be downsized. Use of electrode bump 58 allows with ease an electrical connection between IC electrode 56 and housing connection electrode 53A.

Functional section 55 of angular velocity signal processing IC 54 is connected electrically and directly to housing connection electrodes 53A of housing 51, so that no circuit board is required. As a result, the composite sensor for detecting angular velocity and acceleration can be downsized.

Housing connection electrode 53B is provided on housing 51 at approx. the same plane as the top face of acceleration signal processing IC 60. To be more specific, wiring face 52U is positioned at the same height as the total height of angular velocity signal processing IC 54 and acceleration signal processing IC 60 stacked together on mounting face 52L, and electrode 53B is formed on wiring face 52U. IC electrode 64 is provided on the top face of acceleration signal processing IC 60, and housing connection electrode 53B is connected electrically to IC electrode 64 with wire 65. The foregoing structure allows preventing angular velocity signal processing IC 54 from affecting the electrical connection between IC electrode 64 and housing connection electrode 53B.

As shown in FIG. 6, housing power-supply electrode 52A, housing GND electrode 52B, housing angular velocity output electrode 52C, housing acceleration output electrode 52D, and capacitor electrode 52E are integrally provided on the outer bottom face of housing 51. Although not shown in FIG. 6, inner-layer electrodes and through-hole electrodes are formed in the layers of housing 51. The foregoing structure allows connecting electrodes 52A through 52E to housing connection electrode 53B and other electrodes provided on wiring face 52U.

The detailed description of the connection structure at the inner layers of housing 51 is omitted here. The connection structure discussed above allow connecting housing power-supply electrode 52A to first driving electrodes 45 and second driving electrodes 46 of angular velocity detecting element 41 via angular velocity signal processing IC 54. Housing power-supply electrode 52A is also connected electrically to acceleration detecting element 50 via acceleration signal processing IC 60. Housing GND electrode 52B is electrically connected to GND electrode 49 of angular velocity detecting element 41 via angular velocity signal processing IC 54. Housing angular velocity output electrode 52C is electrically connected to detecting electrodes 47 of angular velocity detecting element 41 via angular velocity signal processing IC 54. Housing acceleration output electrode 52D is connected electrically to acceleration detecting element 50 via acceleration signal processing IC 60. In other words, housing 51 connects angular velocity detecting element 41 to angular velocity signal processing IC 54 electrically as well as connects acceleration detecting element 50 to acceleration signal processing IC 60 electrically.

Capacitors 66 are mounted to capacitor electrodes 52E and used for removing noises. Compartment 67 made of resin is joined to a board (not shown) of a target object, of which angular velocity is to be measured, such that its vertical direction can be in parallel with the angular velocity detecting axis. Housing 51 is accommodated in compartment 67 in which at least four terminals 68 are buried integrally therewith. These at least four terminals 68 are to be connected electrically to housing power-supply electrode 52A, housing GND electrode 52B, housing angular velocity output electrode 52C, and housing acceleration output electrode 52D of housing 51.

Mounting section 69 is placed at approx. center of compartment 67 and generally in parallel with the angular velocity detecting axis. Housing 51 is placed on mounting section 69, in which terminals 68 are buried with their tips 70 exposed from mounting section 69. Placement of housing 51 on mounting section 69 allows electrodes 52A through 52D of housing 51 to be connected electrically to tips 70 of terminal 68 in mounting section 69.

Tips 70 of terminals 68 are also connected mechanically to housing 51. To be more specific, electrodes 52A to 52D are connected to terminals 68 respectively with cream solder, so that housing 51 is eventually supported at its bottom corners by terminals 68 of which opposite ends are buried in compartment 67 integrally. As FIG. 2 shows, eight recesses 71 are formed in the outer bottom face of compartment 67 for receiving electrodes. The opposite ends of terminals 68 are buried in compartment 67 and their tips are exposed from recesses 71. Power-supply electrode 72, GND electrode 73, angular velocity output electrode 74, and acceleration output electrode 75 are thus provided. Other than these electrodes, four fixing electrodes 76 can be provided. On top of that, three recesses 77 are provided in the outer bottom face of compartment 67.

As FIG. 1 shows, metallic cover 78 has three stopper claws 79 at the opening side. Claws 79 are crimped at recesses 77 of compartment 67 shown in FIG. 2, so that GND potential connecting sections 81 can be formed on the outer bottom face of compartment 67.

Figure 7A:
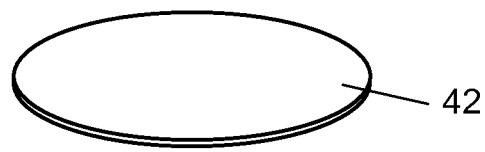
FIG. 7A is a perspective view illustrating a step for assembling the angular velocity detecting element of the composite sensor for detecting angular velocity and acceleration shown in FIG. 1.
Figure 7B:
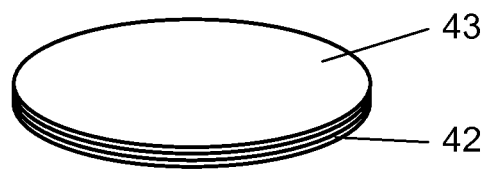
FIG. 7B is a perspective view illustrating a step following the step shown in FIG. 7A for assembling the angular velocity detecting element.
Figure 7C:
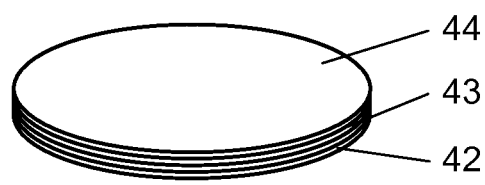
FIG. 7C is a perspective view illustrating a step following the step shown in FIG. 7B for assembling the angular velocity detecting element.

A method of assembling the composite sensor for detecting angular velocity and acceleration discussed above is demonstrated hereinafter with reference to FIG. 7A through FIG. 7F. First, base 42 made of silicon (Si) is prepare as shown in FIG. 7A, then common GND electrode 43 made of alloy thin-film of Pt and Ti is formed by evaporation on the top face of base 42 as shown in FIG. 7B. After that, piezoelectric layer 44 made of PZT thin film is formed by evaporation on the top face of common GND electrode 43 as shown in FIG. 7C.

Figure 7D:
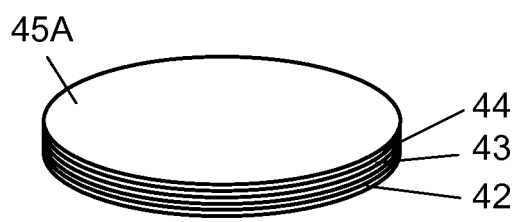
FIG. 7D is a perspective view illustrating a step following the step shown in FIG. 7C for assembling the angular velocity detecting element.
Figure 7E:
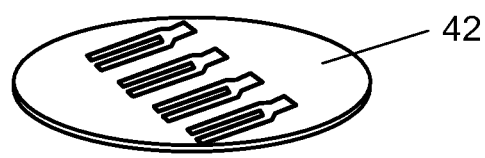
FIG. 7E is a perspective view illustrating a step following the step shown in FIG. 7D for assembling the angular velocity detecting element.

Next, half-done electrode 45A made of alloy thin film of Ti and Au is formed by evaporation on the top face of piezoelectric layer 44 as shown in FIG. 7D, and then unnecessary parts are removed from common GND electrode 43, piezoelectric layer 44, and half-done electrode 45A so that those electrodes can be in given shapes as shown in FIG. 7E. As a result, first driving electrodes 45, second driving electrodes 46, detecting electrode 47, monitoring electrode 48, and GND electrode 49 are formed on the top face of piezoelectric layer 44 as shown in FIG. 3.

Figure 7F:
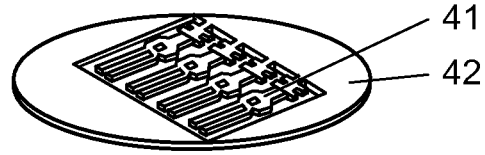
FIG. 7F is a perspective view illustrating a step following the step shown in FIG. 7E for assembling the angular velocity detecting element.
Figure 8:
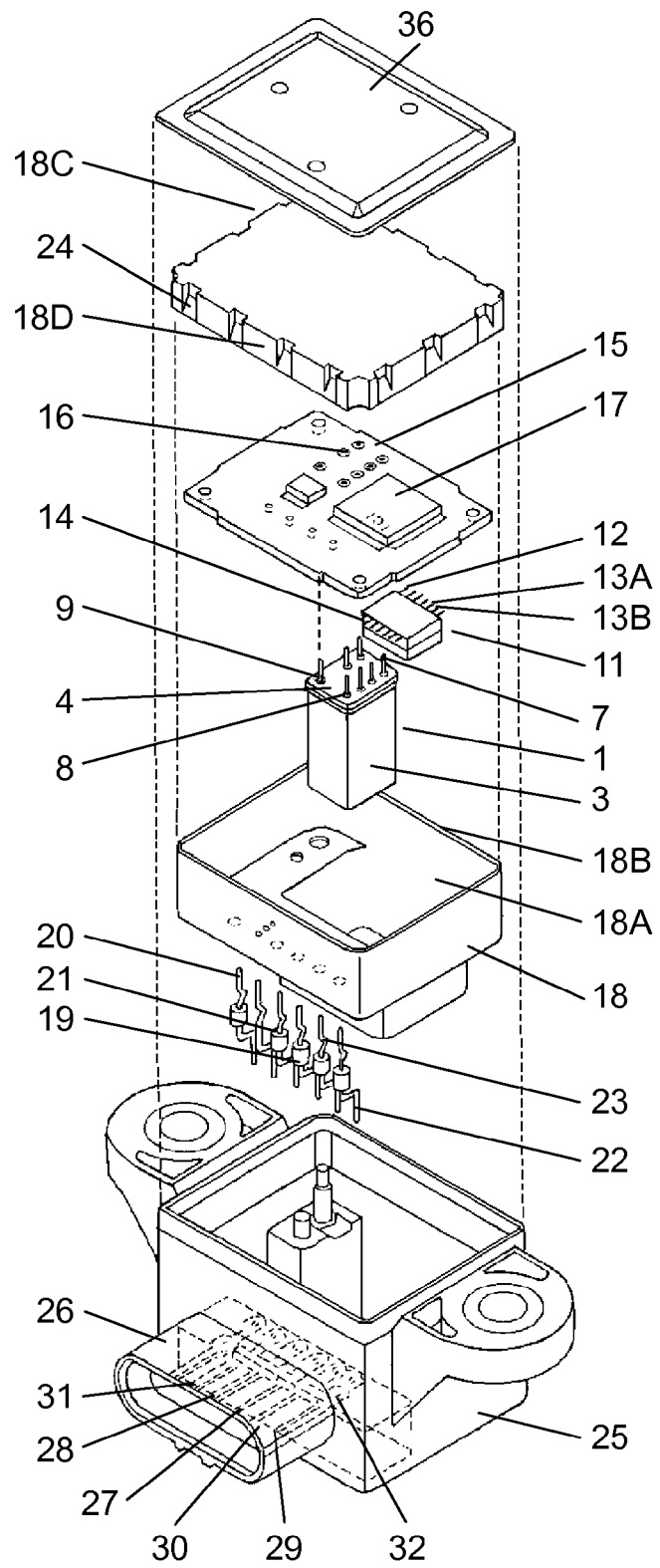
FIG. 8 is an exploded perspective view of a conventional composite sensor for detecting angular velocity and acceleration.
Figure 9:
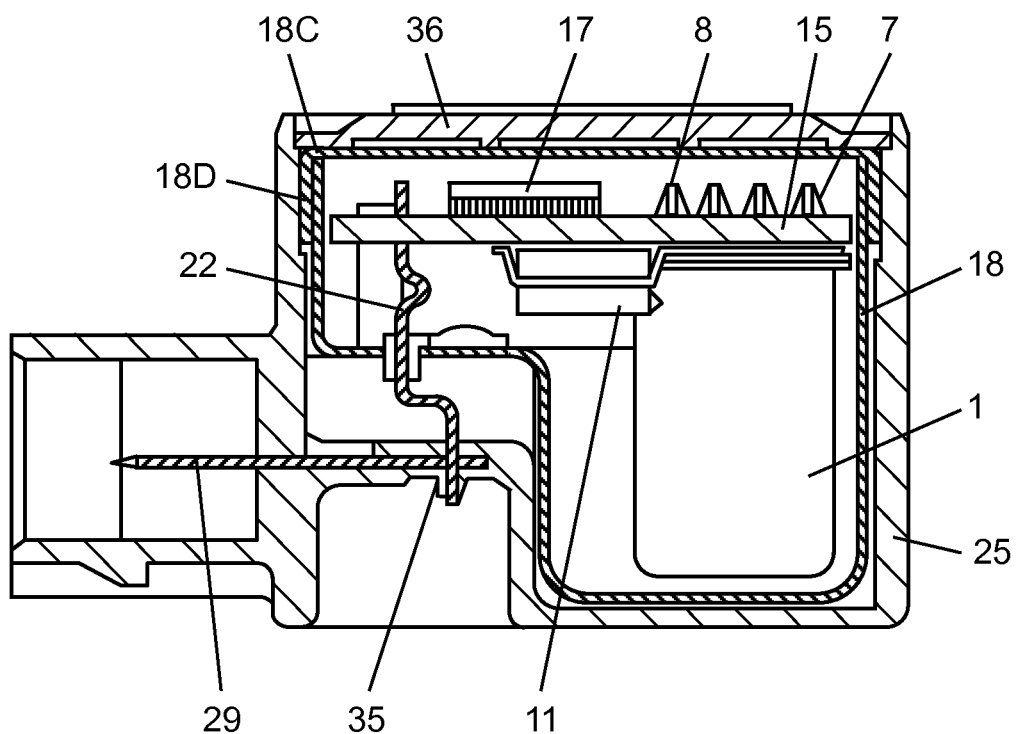
FIG. 9 is a lateral sectional view of the conventional composite sensor for detecting angular velocity and acceleration shown in FIG. 8.
Figure 10:
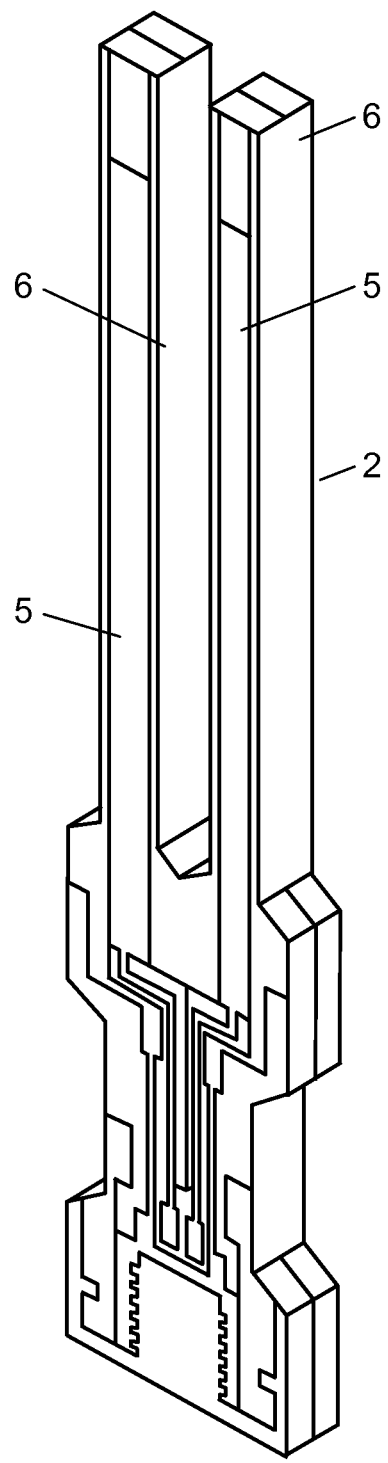
FIG. 10 is a perspective view of a vibrator of the conventional composite sensor for detecting angular velocity and acceleration shown in FIG. 8.
Figure 11:
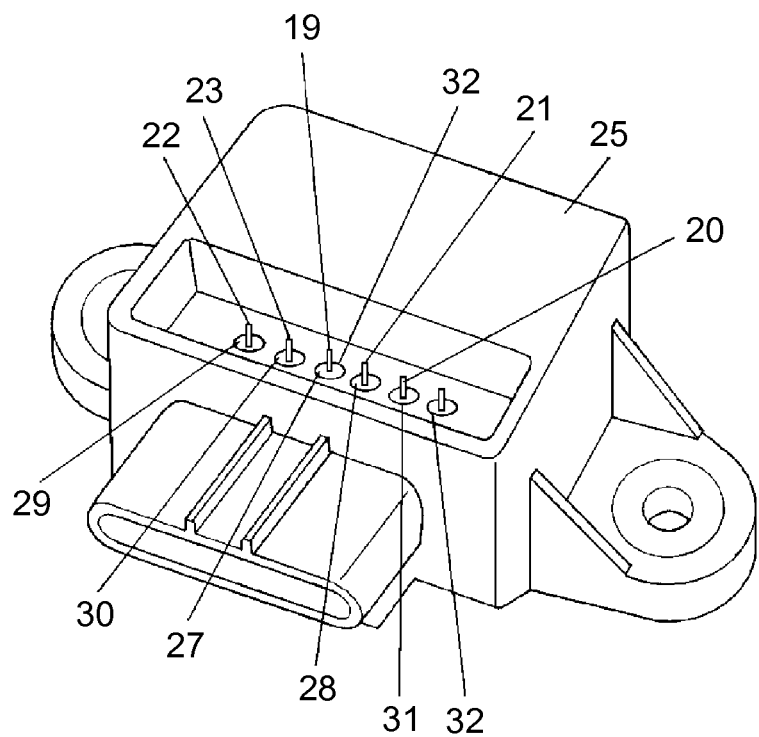
FIG. 11 is a perspective view of the conventional composite sensor for detecting angular velocity and acceleration shown in FIG. 8.

Next, a voltage is applied to common GND electrode 43, and first driving electrode 45, second driving electrode 46, detecting electrode 47, monitoring electrode 48, and GND electrode 49 are grounded, thereby polarizing piezoelectric layer 44. Then unnecessary parts are remove from base 42, thereby forming discrete angular velocity detecting elements 41 as shown in FIG. 7F.

On the other hand, housing 51 formed of a multilayered circuit board made of ceramic insulator (not shown) and wiring conductor (not shown) is prepared. Mounting face 52L, wiring face 52U, step section 53C are previously made on the top face of housing 51. In addition, housing connection electrodes 53A and 53B made of gold (Au) are made at mounting face 52L and wiring face 52U, respectively. On top of that, electrodes 52A through 52E made of silver (Ag) are formed on the underside of housing 51 as shown in FIG. 6.

Next, as shown in FIG. 1, lateral wall 52G made of ceramic is formed around the top face of housing 51, and then metal frame 52F made of kovar is rigidly mounted on the top face of wall 52G.

Next, electrode bumps 58 are placed on the top face of housing connection electrodes 53A of housing 51, and then angular velocity signal processing IC 54 is placed on mounting face 52L such that IC electrodes 56 can be positioned on the top faces of bumps 58.

Next, as shown in FIG. 5, underfill material 59 are poured between housing 51 and angular velocity signal processing IC 54. Then, underfill material 59 is heated at approx. 175° C. for approx. 90 minutes for hardening underfill material 59, so that angular velocity signal processing IC 54 can be solidly fixed onto the top face of housing 51 in a pressed manner.

Housing connection electrodes 53A provided on the inner bottom face (mounting face 52L) of housing 51 are connected electrically to IC electrodes 56 provided on the outer bottom face of IC 54 via electrode bump 58. Angular velocity signal processing IC 54 can be thus compactly, directly, readily, and electrically connected to housing connection electrode 53A.

Next, adhesive 62 is applied onto the top face of non-functional section 57 of angular velocity signal processing IC 54. Then, acceleration signal processing IC 60 is placed on angular velocity signal processing IC 54 such that non-functional section 61 contacts non-functional section 57, and then adhesive 62 is hardened for rigidly mounting acceleration signal processing IC 60 onto the top face of angular velocity signal processing IC 54.

Next, housing connection electrode 53B in housing 51 is electrically connected to IC electrode 64 of IC 60 via wire 65 by the wire-bonding method, and then capacitors 66 are soldered to capacitor electrodes 52E of housing 51.

Next, the underside of junction 41C of angular velocity detecting element 41 is rigidly mounted to the top face of step section 53C of housing 51. Then, first driving electrode 45, second driving electrode 46, detecting electrode 47, monitoring electrode 48, and GND electrode 49 are electrically connected respectively to electrodes provided on wiring face 52U of housing 51 by the wire-bonding method. Next, metallic lid 51A is rigidly mounted to the opening of housing 51 by a seam-welding method in a nitrogen atmosphere.

Next, eight terminals 68 are placed in a mould (not shown). Each of terminals 68 included a bend having undergone a bending process. Then, melting resin is poured into the mould for forming mounting section 69 in which first end of each terminal 68 is to be buried. In the process, tips 70 of terminals 68 are exposed from mounting section 69. With regard to mounting section 69 in such a state, compartment 67 is formed such that the second ends opposite to tips 70 of terminals 68 are buried therein. At this time, recesses 71 for receiving electrodes and recesses 77 are formed on the outer bottom face of compartment 67, and the tips of the second ends of terminals 68 are exposed from recesses 71.

Next, after housing 51 is placed on mounting section 69, tips 70 of terminals 68 are solder to electrodes 52A through 52D from the rear side of mounting section 69. In other words, terminals 68 are electrically connected to electrodes 52A through 52D.

Next, the tips of the second ends of terminals 68 are bent, where the tips are placed in recesses 71, thereby forming power-supply electrode 72, GND electrode 73, angular velocity output electrode 74, acceleration output electrode 75, and four fixing electrodes 76 on the outer bottom face of compartment 67 as shown in FIG. 2.

Finally, cover 78 is put over the compartment 67, and then stopper claws 79 are positioned at recesses 77 on the outer bottom face of compartment 67 for crimping and fixing them together. GND potential connecting sections 81 are thus formed on the outer bottom face of compartment 67.

Hereinafter, the operation of the foregoing composite sensor for detecting angular velocity and acceleration is demonstrated. First, a positive voltage is applied to arm section 41A and first driving electrode 45 provided on arm section 41A of angular velocity detecting element 41, and a negative voltage is applied to second driving electrode 46. Then, piezoelectric layer 44 extends under first driving electrode 45 while piezoelectric layer 44 placed shrinks under second driving electrode 46. First arm section 41A and second arm section 41B of angular velocity detecting element 41 thus open outward.

Next, a negative voltage is applied to first driving electrode 45, and a positive voltage is applied to second driving electrode 46. Then piezoelectric layer 44 shrinks under first driving electrode 45 while piezoelectric layer 44 extends under second driving electrode 46, so that first arm section 41A and second arm section 41B close inward.

In other words, application of an AC voltage to first driving electrode 45 and second driving electrode 46 allows first arm section 41A and second arm section 41B to perform a flexion movement at velocity V with a natural frequency along the in-plane direction. Angular velocity signal processing IC 54 adjusts the voltage to be applied to first driving electrodes 45 and second driving electrodes 46 such that an output signal generated from monitoring electrode 48 can be constant. That is, angular velocity signal processing IC 54 controls the amplitude of the flexion movement of angular velocity detecting element 41.

While first and second arm sections 41A and 41B perform the flexion movement with the natural frequency, assume that angular velocity acts on angular velocity detecting element 41. The operation of element 41 in this status is demonstrated hereinafter. When element 41 rotates at angular velocity "ω" on the center axis (detecting axis) along the longitudinal direction, Coriolis force F=2 mV×ω is generated on first arm section 41A and second arm section 41B of element 41, where "m" stands for mass of arm 41A or 41B.

This Coriolis force allows electric charges to generate on piezoelectric layer 44 under detecting electrodes 47. An output signal formed of those electric charges travels to angular velocity signal processing IC 54 via detecting electrode 47, the inner layer electrodes of housing 51, housing connection electrode 53A, electrode bump 58, and IC electrode 64. Angular velocity signal processing IC 54 provides this signal with waveform processing, and then the processed signal travels to the external computer (not shown) via housing connection electrode 53A, the inner layer electrodes of housing 51, housing angular velocity output electrode 52C, terminal 68, and angular velocity output electrode 74. The external computer detects, i.e. calculates, angular velocity based on this signal.

When acceleration is applied to the composite sensor for detecting angular velocity and acceleration, an output signal is generated in acceleration detecting element 50 in response to the magnitude of the acceleration. The output signal travels to acceleration signal processing IC 60 via the inner layer electrodes of housing 51, housing connection electrode 53B, wire 65, IC electrode 64. After acceleration signal processing IC 60 processes the signal, the processed signal travels to the computer discussed above via wire 65, housing connection electrode 53B, the inner layer electrodes of housing 51, housing acceleration output electrode 52D, terminal 68, and acceleration output electrode 75. The computer detects, i.e. calculates the acceleration based on the signal.

In the foregoing description, angular velocity signal processing IC 54 is placed on mounting face 52L of housing 51, and acceleration signal processing IC 60 is placed on IC 54. However, if the electrode-structure for external connection is reverse with respect to those two ICs, angular velocity signal processing IC 54 can be stacked on acceleration signal processing IC 60. In other words, the lower IC is referred to a first IC, and the upper IC is referred to a second IC whichever angular velocity signal processing IC 54 and acceleration signal processing IC 60 are layered upper or lower. At this time, housing 51 includes mounting face 52L on which first IC is placed, and housing connection electrode 53A as a housing connection electrode first formed on mounting face 52L. The first IC is connected electrically to housing connection electrode 53A with the external connection electrode provided on the functional section.

Housing 51 includes wiring face 51U placed as high as angular velocity signal processing IC 54 and acceleration signal processing IC 60 stacked on mounting face 52L, and second housing connection electrode 53B formed on wiring face 51U. The second IC is connected electrically to housing connection electrode 53B with the external connection electrode provided on the functional section.

INDUSTRIAL APPLICABILITY

The composite sensor for detecting angular velocity and acceleration of the present invention is downsized, so that this sensor is useful as a composite sensor for detecting angular velocity and acceleration to be used for posture control or navigation systems of movable bodies such as aircrafts and vehicles.

The invention claimed is:

1. A composite sensor comprising:
    a first sensing element;
    a second sensing element;
    a first Integrated Circuit (IC) configured to process an output signal supplied from the first sensing element;
    a second Integrated Circuit (IC) configured to process an output signal supplied from the second sensing element, the second IC being placed over the first IC; and
    a package having a first electrode, a second electrode, and an inner bottom face, the package accommodating the first sensing element, the second sensing element, the first IC, and the second IC, wherein the first electrode of the package is connected to the first IC via a first conductor and the second electrode of the package is connected to the second IC via a second conductor, and when viewed in a direction parallel to the inner bottom face of the package, a length of an upper side of a sectional shape of the second IC is shorter than a length of an upper side of a sectional shape of the first IC.

2. The composite sensor according to claim 1, wherein when viewed in a direction parallel to the inner bottom face of the package, each of the second IC and the first IC is without a hollow region.

3. The composite sensor according to claim 1, wherein a thickness of the second IC is smaller than a thickness of the first IC.

4. The composite sensor according to claim 1, wherein the second electrode of the package is a metal wire.

5. The composite sensor according to claim 1, wherein the first conductor is an electrode bump.

6. The composite sensor according to claim 1, wherein the first sensing element is an angular velocity detecting element configured to detect angular velocity, and the second sensing element is an acceleration detecting element configured to detect acceleration.

7. The composite sensor according to claim 1, wherein the first electrode of the package and the second electrode of the package comprise gold.

8. The composite sensor according to claim 1, wherein the first IC has an upper surface and a bottom surface, the second IC has an upper surface and a bottom surface, the bottom surface of the first IC has an electrode connected to the first electrode of the package via the first conductor, the upper surface of the second IC has an electrode connected to the second electrode of the package via the second conductor.

9. The composite sensor according to claim 1 further comprising:
    an adhesive positioned between the first IC and the second IC.

10. The composite sensor according to claim 1, wherein the second electrode of the package is positioned higher than the first electrode of the package when viewed in a direction parallel to the inner bottom face of the package.

11. The composite sensor according to claim 1, wherein the package has a substrate.

12. The composite sensor according to claim 1, wherein the package has a substrate, and the substrate has the first electrode of the package and the inner bottom face.

13. The composite sensor according to claim 1, wherein the package has a substrate, the substrate has the first electrode of the package and the inner bottom face, the substrate has a base on the substrate, the base having a top surface higher than the inner bottom face when viewed in a direction parallel to the inner bottom face of the package, the base has the second electrode of the package, and the second electrode of the package is positioned higher than the first electrode.

14. The composite sensor according to claim 1, wherein the package has a substrate, and
    the substrate, the first IC, and the second IC are stacked in this order.

15. The composite sensor according to claim 1, wherein the package has a substrate, the substrate, the first IC, and the second IC are stacked in this order, and the second electrode of the package is positioned higher than the first electrode of the package when viewed in a direction parallel to the inner bottom face of the package.

16. The composite sensor according to claim 1, further comprising: an underfill material provided on a bottom surface of the first IC.

17. The composite sensor according to claim 1, wherein the package has layers of ceramic and wiring conductors.

18. The composite sensor according to claim 1, wherein the package accommodates a housing and an electrical component.

* * * * *